United States Patent
Takizawa

(10) Patent No.: US 8,724,358 B2
(45) Date of Patent: May 13, 2014

(54) STACKED STRUCTURE OF POWER CONVERSION APPARATUS

(75) Inventor: Satoki Takizawa, Hino (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 254 days.

(21) Appl. No.: 13/347,126

(22) Filed: Jan. 10, 2012

(65) Prior Publication Data

US 2012/0188807 A1    Jul. 26, 2012

(30) Foreign Application Priority Data

Jan. 25, 2011   (JP) .................................. 2011-013252

(51) Int. Cl.
*H02M 7/537*    (2006.01)

(52) U.S. Cl.
USPC ........................................... 363/141; 361/697

(58) Field of Classification Search
USPC ............. 363/141, 71; 361/678, 697, 709–711
See application file for complete search history.

(56) References Cited

U.S. PATENT DOCUMENTS 6,219,266 B1 *   4/2001   Pfauser ......................... 363/141

FOREIGN PATENT DOCUMENTS

| JP | 08-126349 A   | 5/1996 |
| JP | 10-023768 A   | 1/1998 |
| JP | 2005-117783 A | 4/2005 |
| JP | 2006-042406 A | 2/2006 |

* cited by examiner

*Primary Examiner* — Harry Behm
(74) *Attorney, Agent, or Firm* — Rabin & Berdo, P.C.

(57) ABSTRACT

A stacked structure of a power converter is disclosed. The stacked structure has a power conversion circuit that provides an output or input of alternating current in three phases and is composed of odd-numbered parallel-connected power semiconductor element modules for each phase, and a heat sink for cooling the power semiconductor element modules. An odd number of the parallel-connected power semiconductor element modules are arranged in a first phase and a third phase, and an even number of the parallel-connected power semiconductor element modules are arranged in a second phase respectively in two rows on the heat sink relative to a ventilation direction of air for cooling the heat sink.

6 Claims, 11 Drawing Sheets

VENTILATION DIRECTION OF AIR

VENTILATION DIRECTION OF AIR

US 8,724,358 B2

STACKED STRUCTURE OF POWER CONVERSION APPARATUS

CROSS REFERENCE TO RELATED APPLICATION

The entire disclosure of the inventor's corresponding Japanese patent application, Serial No. JP PA 2011-013252, filed Jan. 25, 2011, is hereby incorporated by reference.

BACKGROUND OF THE INVENTION

1. Field of the Invention

The present invention relates to a stacked structure of a power converter configured by connecting power semiconductor modules in parallel.

2. Description of the Related Art

IGBT modules generally require a heat sink for cooling heat due to generation loss. A typical aluminium heat sink is shown in FIG. 9. It usually has a shape of a rectangular solid, is composed of a heat reception part 19 and a fin part 20 and effects cooling by ventilating the fin part 20. Three IGBT modules, according to the example shown in FIG. 7, connected in parallel are placed in the heat reception part as nine modules of all phases or as separate phases each containing three modules, as shown in FIGS. 10 and 11, respectively.

The configuration of IGBT modules containing two elements and examples of closely-positioned three parallel-connected IGBT modules are disclosed in, for example, Japanese Patent Application Laid-open No. 2005-117783.

As described above, in a power converter in which IGBT modules are connected in parallel, the IGBT modules need to be arranged closely to a heat reception part as shown in FIG. 10 in which all nine modules are arranged on one heat sink or FIG. 11 in which each phase containing three modules is arranged on a heat sink, in view of attaining a balance in current between IGBT modules.

However, when the number of parallel-connected modules is increased (e.g. five in the case of FIG. 12), the overall size of a converter may not be reduced as shown in FIG. 13 where three phases are arranged elongated in X (lateral) direction.

On the other hand, when modules are arranged in two rows relative to a ventilation direction, the length in X (lateral) direction can be shortened, as shown in FIG. 14A in which three phases of three parallel-connected IGBT modules are arranged on one heat sink; FIG. 14B in which each phase of three parallel-connected IGBT modules is arranged on each heat sink; FIG. 15A in which three phases of five parallel-connected IGBT modules are arranged on one heat sink; and FIG. 15B in which each phase of five parallel-connected IGBT modules is arranged on each heat sink.

However, when the number of parallel-connected modules is odd, contrary to the case when the number is even, dead space is created as shown in FIGS. 14 and 15 by the dotted line 21 (shown partially; the same applies for the rest), less promoting effective utilization of a heat sink.

When five and four modules are arranged respectively on the windward and leeward sides as shown in FIG. 16 (in the case of three parallel-connected IGBT modules), dead space can be reduced compared to the cases shown in FIGS. 14 and 15. However, because two IGBT modules in the V phase are arranged on the leeward side, those two modules have higher thermal load than the IGBT modules in the other phases, resulting in the requirement for a thermal design based on the V phase.

SUMMARY OF THE INVENTION

FIG. 17 shows an example in which five parallel-connected IGBT modules are arranged on two heat sinks.

In this case, the heat sinks 1A and 1B contain different number of IGBT modules arranged thereon, so that a thermal design based on the heat sink 1A having more IGBT modules is required; as a result, a heat sink and a fan having higher radiation capacity are required.

Thus, an object of the present invention is to effectively utilize heat sinks in order to downsize heat sinks and reduce the cost and the required fan capacity.

In order to solve the above problems, a stacked structure of a power converter may be provided including: a power conversion circuit that provides an output or input of alternating current in three phases and is composed of basically odd-numbered parallel-connected power semiconductor element modules for each phase; and a heat sink for cooling the power semiconductor element modules, wherein an odd number of the parallel-connected power semiconductor element modules are arranged in a first phase and a third phase, and an even number of the parallel-connected power semiconductor element modules are arranged in a second phase respectively in two rows on the heat sink relative to a ventilation direction of air for cooling the heat sink.

Also, a stacked structure of a power converter may be provided including: a power conversion circuit that provides an output or input of alternating current in three phases and is composed of basically odd-numbered parallel-connected power semiconductor element modules for each phase; and a heat sink for cooling the power semiconductor element modules, wherein five of the parallel-connected power semiconductor element modules are arranged in a first phase and a third phase, and six of the parallel-connected power semiconductor element modules are arranged in a second phase respectively in two rows on two heat sinks relative to a ventilation direction of air for cooling the heat sinks, such that the five modules in the first phase and the three modules in the second phase are arranged in one heat sink and the three modules in the second phase and the five modules in the third phase are arranged in the other heat sink.

Additionally, the phase in which the even-numbered modules are arranged can be arranged at a central part of the heat sink. Further, the two rows of the power semiconductor element modules can be arranged on the heat sink so as to be in two separate rows relative to the ventilation direction.

According to the present invention, the heat sink(s) can be effectively utilized so that the heat sink(s) are downsized and the cost and the required fan capacity are also reduced. As a result, stacks of a power converter and the overall size of a power converter can be reduced and the cost thereof can be reduced.

DESCRIPTION OF THE PREFERRED EMBODIMENTS

Figure 6:
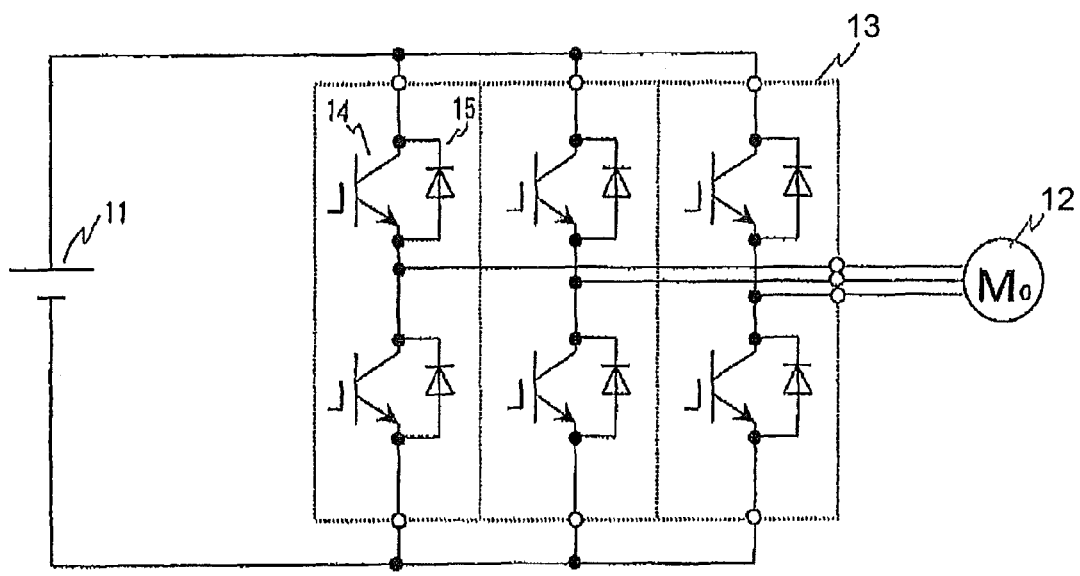
FIG. 6 is a circuit constitution diagram of a general example of an inverter.

FIG. 6 shows a main circuit diagram of a power converter such as, for example, an inverter. In this figure, 11 is a DC (direct current) power source (circuit), 12 is load such as a motor (Mo), and 13 is a power converting part (inverter) consisting of power semiconductor elements which can provide an alternating current (AC) output of a variable voltage and frequency. The DC power source (circuit) 11 may be generally composed of an electrolytic capacitor having large capacitance through an AC power source and a diode rectifier.

In the inverter 13, the numeral 14 represents an IGBT (Insulated Gate Bipolar Transistor) as a switching element and 15 represents a diode which is connected in anti-parallel to the IGBT, and 6 circuits respectively comprising these elements compose the inverter. The IGBT module may be composed of a pair of two, upper and lower, elements or of a set of six elements. An inverter providing an output in three phases and having a capacitance above a certain level may be composed of IGBT modules respectively containing two elements, the number of which modules may be a multiple of three.

Figure 7:
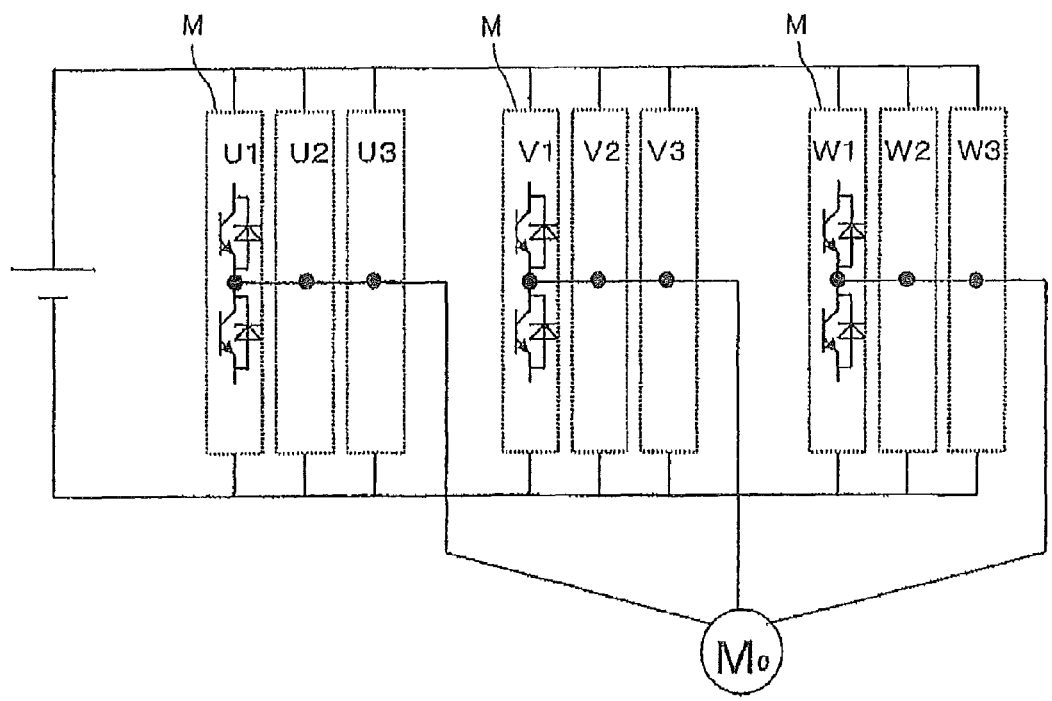
FIG. 7 is a constitution diagram showing an inverter circuit of three parallel-connected power semiconductor modules.
Figure 8:
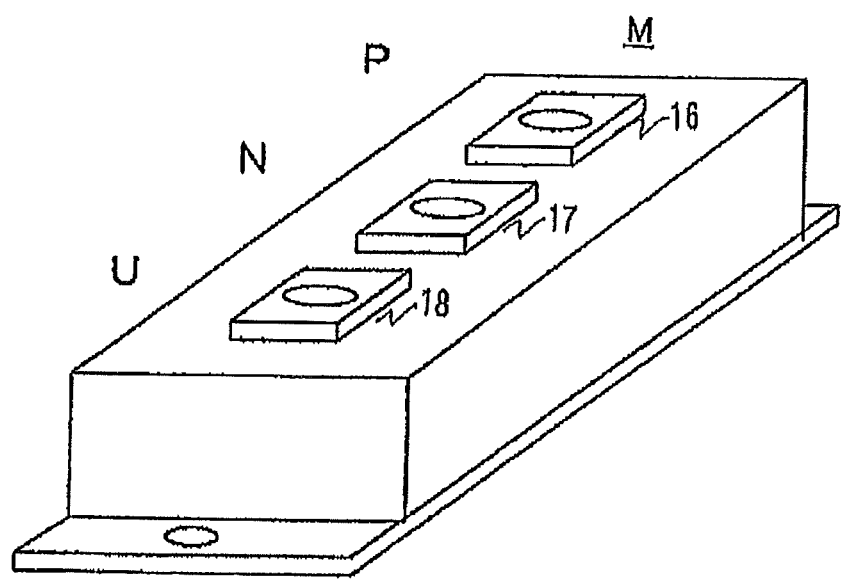
FIG. 8 is an outer view of a power semiconductor module containing two elements.
Figure 9:
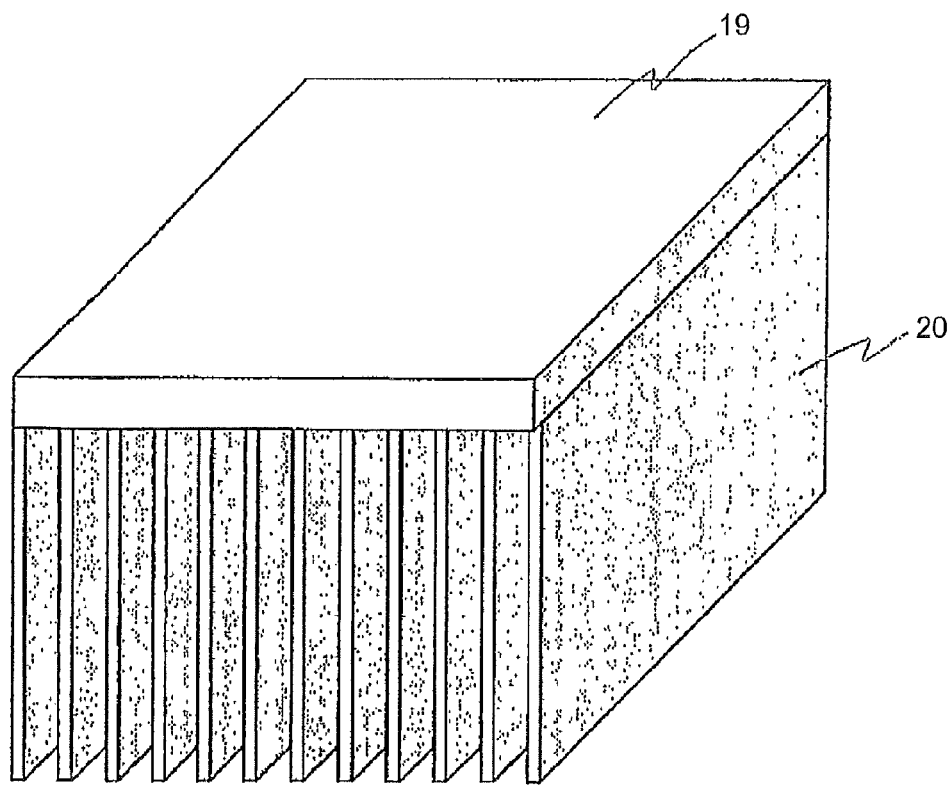
FIG. 9 is an outer view of an aluminium heat sink.
Figure 10:
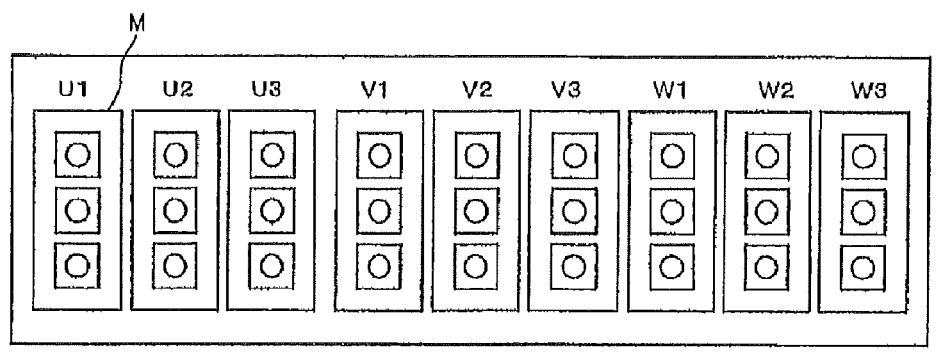
FIG. 10 is a top view showing an example in which power semiconductor modules of three phases are arranged on one heat sink.
Figure 11:
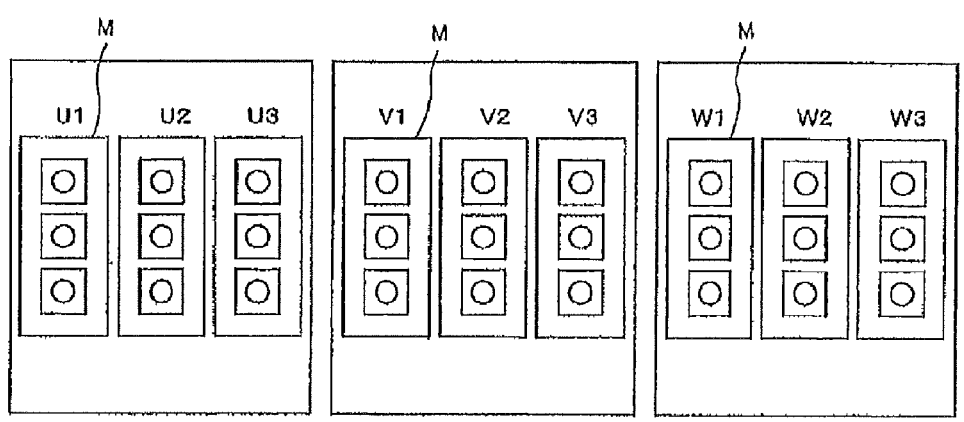
FIG. 11 is a top view showing an example in which power semiconductor modules of three phases are arranged on three heat sinks.
Figure 12:
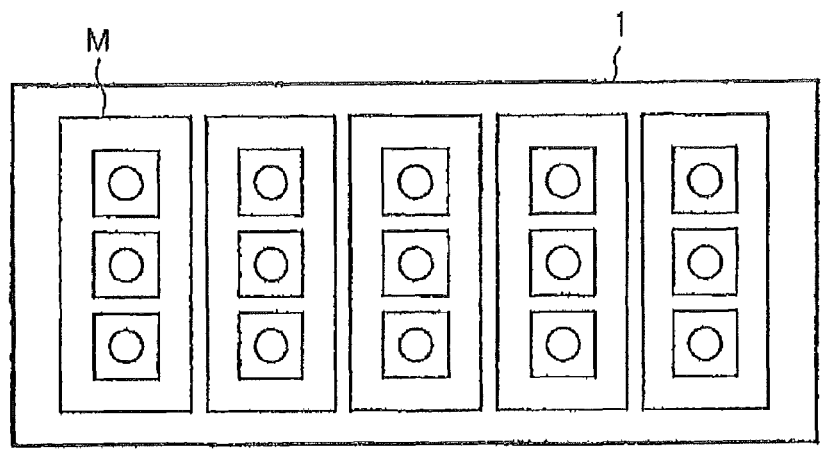
FIG. 12 is a top view showing an example in which power semiconductor modules of one phase are arranged on one heat sink.
Figure 13:
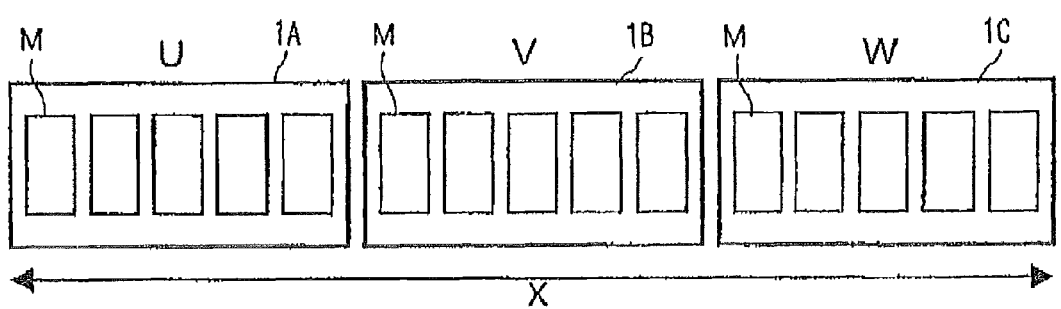
FIG. 13 is a top view showing an example in which power semiconductor modules of three phases are arranged on three heat sinks.
Figure 14A:
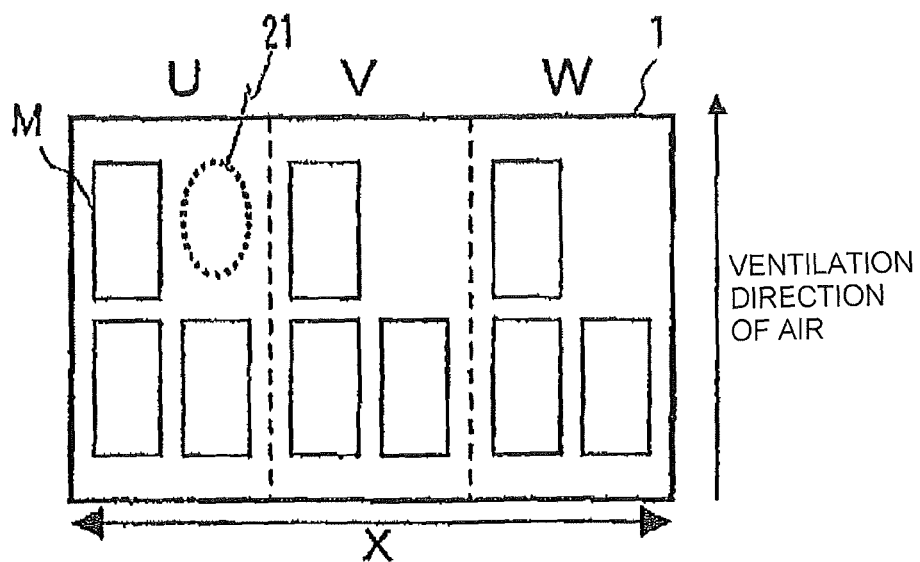
FIG. 14 is a top view showing an example in which three parallel-connected power semiconductor modules are arranged on a heat sink(s)
Figure 14B:
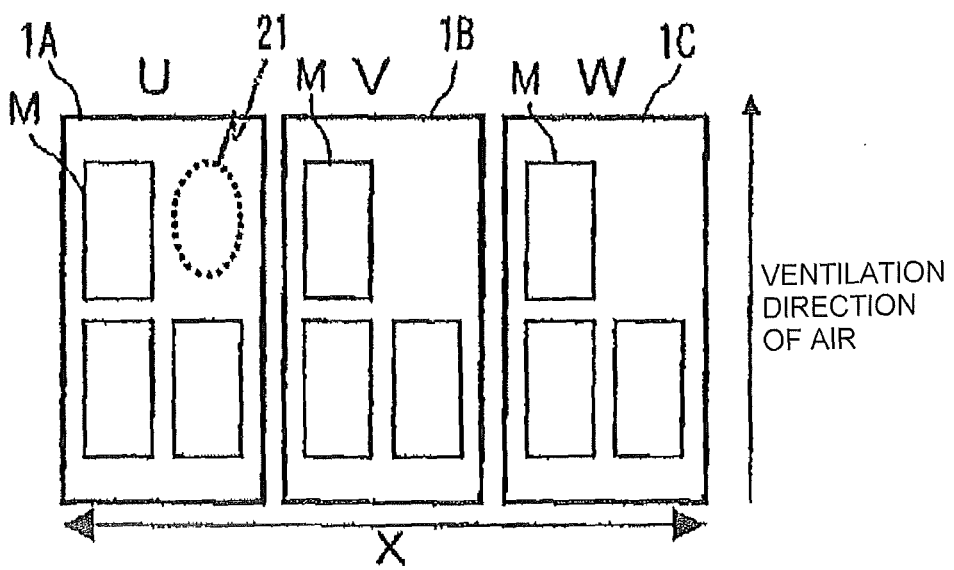
Figure 15A:
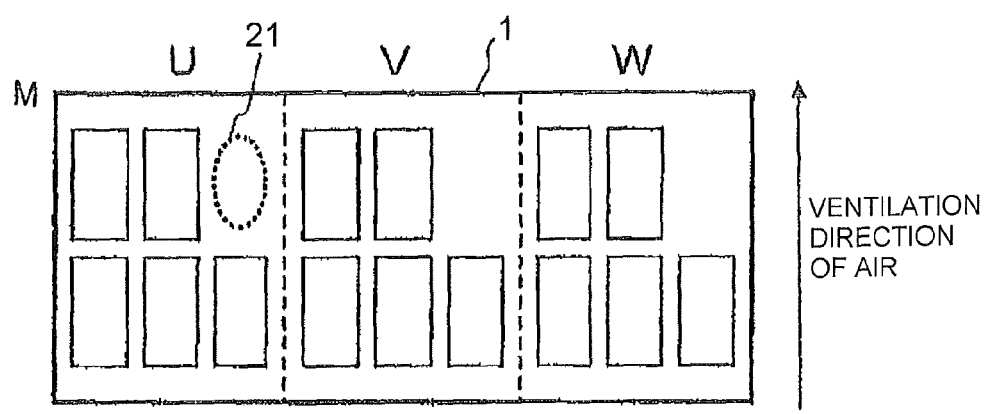
FIG. 15 is a top view showing an example in which five parallel-connected power semiconductor modules are arranged on a heat sink(s)
Figure 15B:
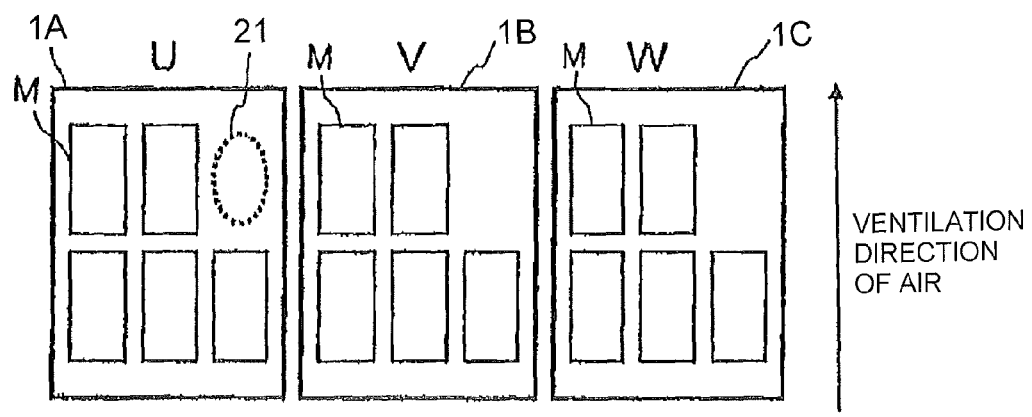
Figure 16:
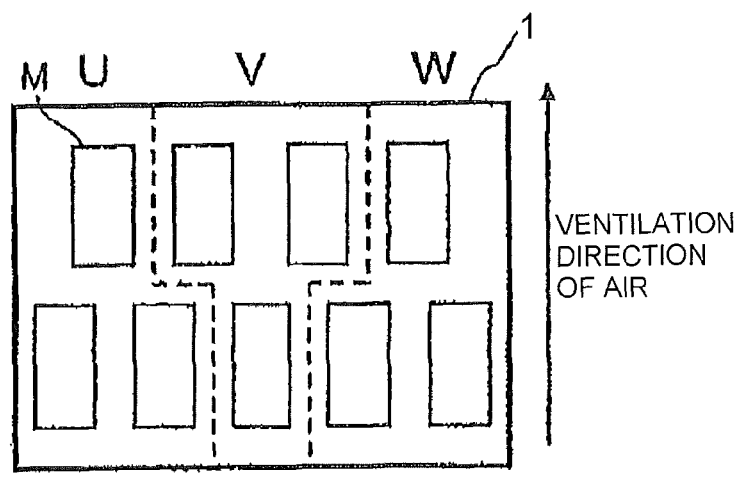
FIG. 16 is a top view showing an variant of FIG. 14A.

When capacity of a power converter is to be increased, a standard of a current of elements may be increased. For this purpose, an IGBT module having high standard of a current may be applied or IGBT modules may need to be connected in parallel. FIG. 7 illustrates three IGBT modules M each containing two elements are connected in parallel in each phase. FIG. 8 illustrates an exterior appearance of an IGBT module M containing two elements. The module M comprises, as shown in FIG. 8, for example, a terminal 16 (P) as a positive terminal, a terminal 17 (N) as a negative terminal, an output terminal 18 (U) and the like.

Figure 1:
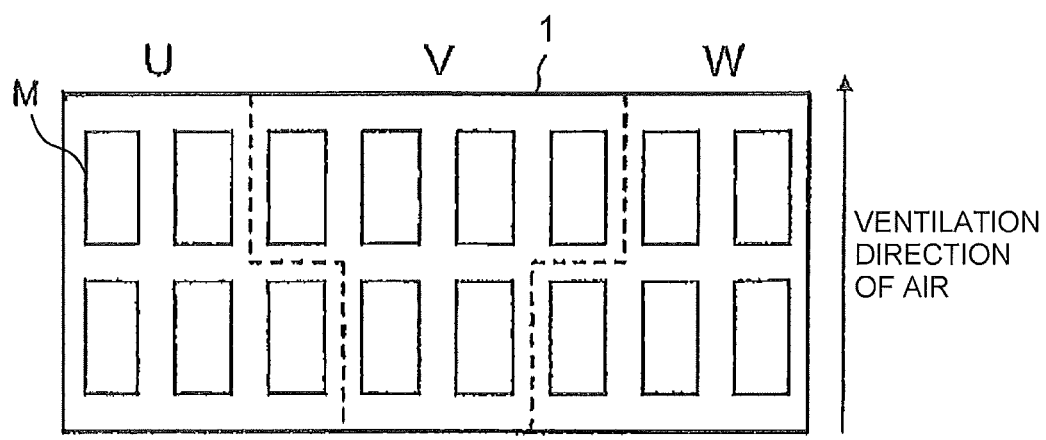
FIG. 1 is a constitution diagram showing an aspect of the present invention.
Figure 17:
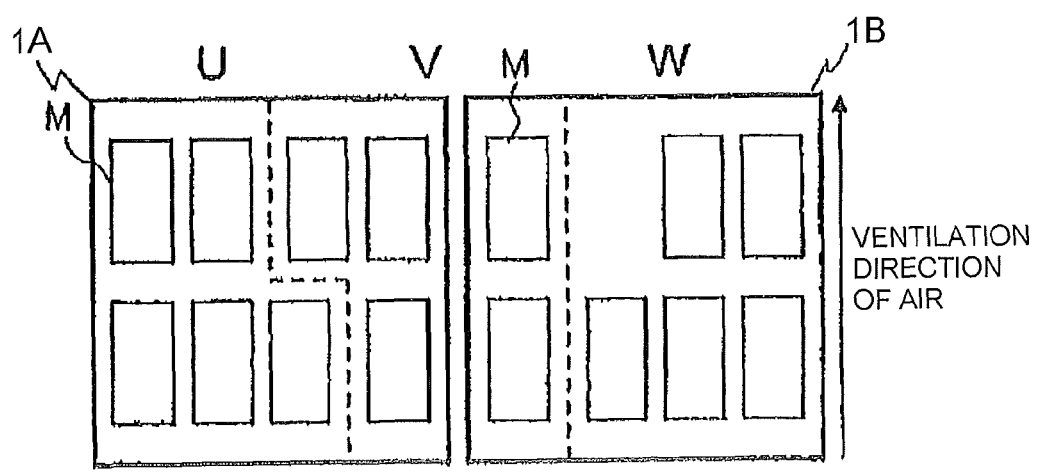
FIG. 17 is a top view showing an example in which five parallel-connected power semiconductor modules are arranged on two heat sinks.

FIG. 1 depicts a constitution diagram. In this embodiment, five IGBT modules M are connected in parallel in the U and W phases and six IGBT modules M are connected in parallel in the V phase. According to this configuration, there is no dead space at the heat reception part of the heat sink 1, allowing effective utilization of the heat sink 1. Thermal load on the V phase, which is higher than other phases in FIG. 17, can be decreased due to one more module therein than in other phases.

Figure 2:
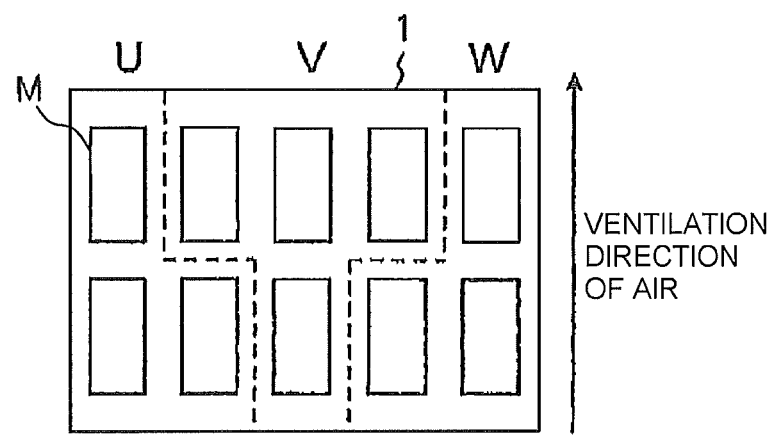
FIG. 2 is a constitution diagram showing an aspect having a different number of parallel-connected modules in FIG. 1.

In FIG. 2, three IGBT modules M are connected in parallel in the U and W phases and four IGBT modules M are connected in parallel in the V phase, i.e. the details other than the number of the modules connected in parallel are the same as above FIG. 1; thus detailed explanation is omitted.

Figure 3:
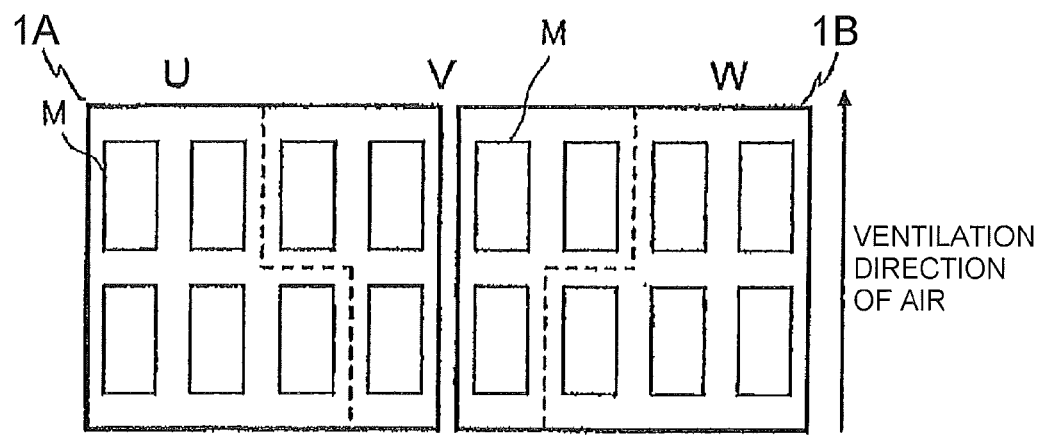
FIG. 3 is a constitution diagram showing another aspect of the present invention.

FIG. 3 shows another aspect of the present invention.

In this aspect, five IGBT modules M are connected in parallel in the U and W phases and six IGBT modules M are connected in parallel in the V phase as similar to FIG. 1, except that two heat sinks 1A and 1B are provided. According to this configuration, thermal loads (total generation loss of IGBT modules) on the heat sinks 1A and 1B are equalized and generation loss per one module in the V phase is reduced to ⅚ compared to that in FIG. 17; thus thermal load (total generation loss of IGBT modules) on whole heat sink is decreased, so that the heat sink can be downsized and the required fan capacity can be decreased.

Figure 4:
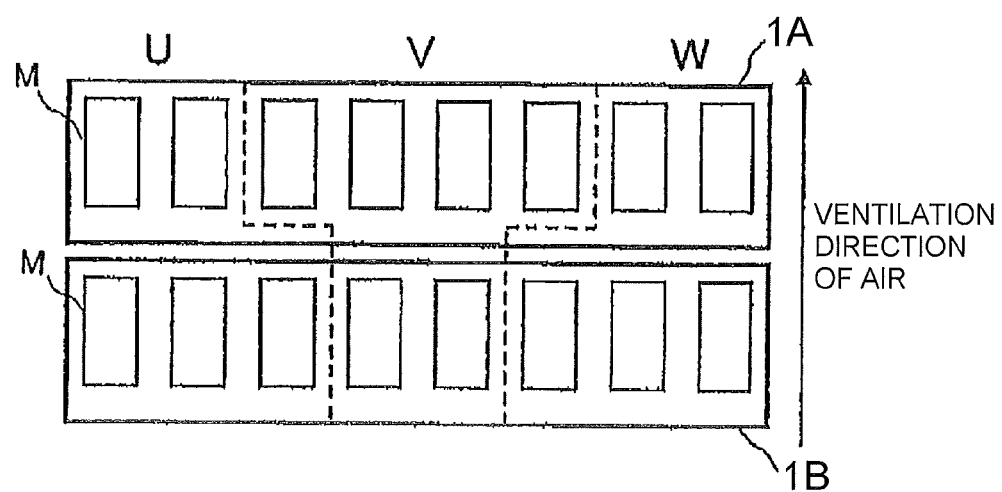
FIG. 4 is a constitution diagram showing a variant of the aspect of FIG. 1.

FIG. 4 shows variants of FIGS. 1 and 2.

In this embodiment, the heat sink 1 having two rows is divided into upper and lower parts and the modules M in the first and second rows are arranged on the heat sinks 1A and 1B, respectively. According to this configuration, thermal load on the heat sinks 1A and 1B can be equalized.

Figure 5:
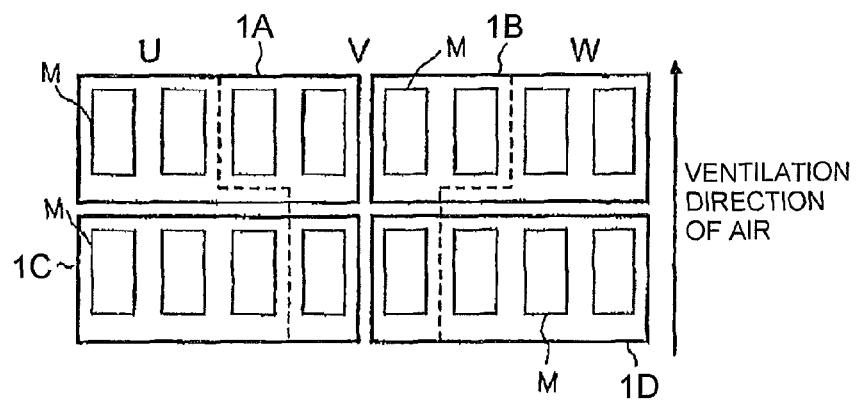
FIG. 5 is a constitution diagram showing a variant of the aspect of FIG. 3.

FIG. 5 shows a variant of FIG. 3, in which the modules M in the first row and in the second row in FIG. 3 are arranged on the heat sinks 1A and 1B, and 1C and 1D, respectively. According to this configuration, thermal load on the heat sinks 1A through 1D can be equalized.

The embodiments in which three and five IGBT modules are connected in parallel are illustrated hereinabove; however, the present invention can be generally applied to the embodiments in which the number of modules connected in parallel is basically odd such as seven (in which case eight modules are connected in parallel in the V phase) and nine (in which case ten modules are connected in parallel in the V phase). In addition, the present invention can be equally applied to the embodiments in which elements are not only IGBTs but also power semiconductor modules such as MOS-FETs and diodes and in which the converter is providing an alternating current input.

It will be apparent to those skilled in the art that various modifications and variations can be made to the disclosed power converter. Other embodiments will be apparent to those skilled in the art from consideration of the specification and practice of the disclosed method and apparatus. It is intended that the specification and examples be considered as exemplary only, with a true scope being indicated by the following claims.

What is claimed is:

1. A stacked structure of a power converter, comprising:
    a power conversion circuit that provides an output or an input of alternating current and is composed of a plurality of parallel-connected power semiconductor element modules and at least one heat sink configured to cool the power semiconductor element modules; wherein
    the plurality of parallel-connected power semiconductor element modules are arranged in two rows on the at least one heat sink relative to a ventilation direction of air for cooling the at least one heat sink; and
    an odd number of the plurality of parallel-connected power semiconductor element modules are arranged in a first phase, an odd number of the plurality of parallel-connected power semiconductor element modules are arranged in a third phase, and an even number of the parallel-connected power semiconductor element modules are arranged in a second phase;

the at least one heat sink includes a first heat sink and a second heat sink; and at least one of the power semiconductor element modules in the first phase and at least one of the power semiconductor element modules in the second phase are arranged in the first heat sink, and at least one of the power semiconductor element modules in the third phase and at least one of the power semiconductor element modules in the second phase are arranged in the second heat sink.

2. The stacked structure of the power converter according to claim 1, wherein the even number of the plurality of parallel-connected power semiconductor element modules arranged in the second phase are disposed at a central part of the at least one heat sink.

3. The stacked structure of the power converter according to claim 1, wherein the two rows of the power semiconductor element modules are arranged on the at least one heat sink so as to be in two separate rows relative to the ventilation direction.

4. The stacked structure of the power converter according to claim 1, wherein the even number of the plurality of parallel-connected power semiconductor element modules arranged in the second phase are disposed between the odd number of the plurality of parallel-connected power semiconductor element modules arranged in the first phase and the odd number of the plurality of parallel-connected power semiconductor element modules arranged in the third phase.

5. A stacked structure of a power converter, comprising:

a power conversion circuit that provides an output or input of alternating current and is composed of a plurality of parallel-connected power semiconductor element modules and a plurality of heat sinks configured to cool the power semiconductor element modules; wherein the plurality of parallel-connected power semiconductor element modules are arranged, relative to a ventilation direction of air for cooling the plurality of heat sinks, in two rows on a first heat sink and a second heat sink;

five of the plurality of parallel-connected power semiconductor element modules are arranged in a first phase, five of the plurality of parallel-connected power semiconductor element modules are arranged in a third phase, and six of the plurality of parallel-connected power semiconductor element modules are arranged in a second phase; and the five power semiconductor element modules in the first phase and three of the six power semiconductor element modules in the second phase are arranged in the first heat sink, and the five power semiconductor element modules in the third phase and three of the six power semiconductor element modules in the second phase are arranged in the second heat sink.

6. A stacked structure of a power converter, comprising:

a power conversion circuit that provides an output or an input of alternating current and is composed of a plurality of parallel-connected power semiconductor element modules and a plurality of heat sinks configured to cool the power semiconductor element modules; wherein the plurality of parallel-connected power semiconductor element modules are arranged in a first row and a second row on the plurality of heat sinks relative to a ventilation direction of air for cooling the plurality of heat sinks;

an odd number of the plurality of parallel-connected power semiconductor element modules are arranged in a first phase, an odd number of the plurality of parallel-connected power semiconductor element modules are arranged in a third phase, and an even number of the parallel-connected power semiconductor element modules are arranged in a second phase;

the first row of power semiconductor element modules is arranged on a first heat sink of the plurality of heat sinks and the second row of power semiconductor element modules is arranged on a second heat sink of the plurality of heat sinks; and at least one of the power semiconductor element modules in the first phase and at least one of the power semiconductor element modules in the second phase are arranged in the first heat sink, and at least one of the power semiconductor element modules in the third phase and at least one of the power semiconductor element modules in the second phase are arranged in the second heat sink.

* * * * *